US011158502B2

(12) United States Patent
Liu et al.

(10) Patent No.: US 11,158,502 B2
(45) Date of Patent: Oct. 26, 2021

(54) METHODS OF FORMING NANO-SCALE AND MICRO-SCALE STRUCTURED MATERIALS AND MATERIALS FORMED THEREBY

(71) Applicant: Purdue Research Foundation, West Lafayette, IN (US)

(72) Inventors: Chunghorng Richard Liu, West Lafayette, IN (US); Zhikun Liu, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 519 days.

(21) Appl. No.: 14/864,235

(22) Filed: Sep. 24, 2015

(65) Prior Publication Data

US 2016/0264407 A1   Sep. 15, 2016

Related U.S. Application Data

(60) Provisional application No. 62/055,222, filed on Sep. 25, 2014.

(51) Int. Cl.

| H01L 21/02 | (2006.01) |
| C23C 18/12 | (2006.01) |
| B81C 1/00 | (2006.01) |
| C23C 18/14 | (2006.01) |
| H01L 29/06 | (2006.01) |

(Continued)

(52) U.S. Cl.
CPC .... *H01L 21/02565* (2013.01); *B81C 1/00031* (2013.01); *C23C 18/1204* (2013.01); *C23C 18/125* (2013.01); *C23C 18/1216* (2013.01); *C23C 18/1233* (2013.01); *C23C 18/143* (2019.05); *H01L 21/0259* (2013.01); *H01L 21/02557* (2013.01); *H01L 21/02606* (2013.01); *H01L 21/02628* (2013.01); *H01L 21/02636* (2013.01); *B82B 3/0033* (2013.01); *B82Y 40/00* (2013.01); *H01L 29/0669* (2013.01); *H01L 29/22* (2013.01); *H01L 29/24* (2013.01); *Y10S 977/762* (2013.01); *Y10S 977/811* (2013.01); *Y10S 977/824* (2013.01); *Y10S 977/892* (2013.01);

(Continued)

(58) Field of Classification Search
CPC . C23C 18/12; C23C 18/1204; C23C 18/1208; C23C 18/1216; Y10S 977/893
See application file for complete search history.

(56) References Cited

U.S. PATENT DOCUMENTS

| 4,511,595 A | * | 4/1985 | Inoue | ............... B23K 26/08 |
| | | | | 118/641 |
| 6,129,901 A | | 10/2000 | Moskovits et al. | |

(Continued)

*Primary Examiner* — Joel G Horning
(74) *Attorney, Agent, or Firm* — Hartman Global IP Law; Gary M. Hartman; Domenica N. S. Hartman (57) ABSTRACT

Methods of forming porous nano-scale or micro-scale structured materials and structured materials formed thereby. Such methods entail providing a donor material and reacting the donor material to form a compound that deposits on a surface of a substrate to produce nano-scale or micro-scale geometric features of the structured material. In particular embodiments, the donor material is in a solution and the reacting step is performed by contacting the surface of the substrate with the solution and directing heat through the solution onto the surface to locally heat a portion of the solution in contact therewith.

11 Claims, 9 Drawing Sheets

(51) Int. Cl.
  *H01L 29/22*   (2006.01)
  *H01L 29/24*   (2006.01)
  *B82B 3/00*    (2006.01)
  *B82Y 40/00*   (2011.01)

(52) U.S. Cl.
  CPC ........ *Y10S 977/932* (2013.01); *Y10S 977/948* (2013.01)

(56) References Cited

U.S. PATENT DOCUMENTS

| | | |
|---|---|---|
| 6,841,142 B1 | 1/2005 | Tenne et al. |
| 7,538,062 B1 | 5/2009 | Dai et al. |
| 8,318,126 B2 * | 11/2012 | Wong ................. B01J 23/06 423/592.1 |
| 2009/0318296 A1 * | 12/2009 | Sohma ................ C23C 18/1216 505/325 |
| 2011/0233487 A1 | 9/2011 | Hur et al. |

* cited by examiner

METHODS OF FORMING NANO-SCALE AND MICRO-SCALE STRUCTURED MATERIALS AND MATERIALS FORMED THEREBY

CROSS REFERENCE TO RELATED APPLICATIONS

This application claims the benefit of U.S. Provisional Application No. 62/055,222, filed Sep. 25, 2014, the contents of which are incorporated herein by reference.

BACKGROUND OF THE INVENTION

The present invention generally relates to the manufacture of nano-scale and micro-scale structured materials. More particularly, this invention relates to methods capable of forming porous structured materials comprising porous nano-scale or micro-scale geometric features.

The outstanding potential of nano-scale and micro-scale structured materials is well known, as is the importance of their size, structure, and properties. For example, polycrystalline nanostructures having a very high surface-to-volume ratio are very desirable for the electrochemical/capacitive, catalytic/chemical, sensing, and filtering industries. On the other hand, single/mono crystal nanostructures having improved electronic mobility and strength are desirable for the solar cell, microelectromechanical system (MEMS), nanoelectronic, semiconductor, superconductor, and mechanical industries, including such nonlimiting examples as lithium ion batteries, supercapacitors, gas sensors, and photoelectrochemical devices. As used herein, nano-scale or nanoscopic scale structured materials are defined as structures comprising geometric features having lengths or heights of about 1 to 100 nanometers, and micro-scale or microscopic scale structured materials are defined as structures with geometric features having lengths or heights of about 0.1 to 100 micrometers. Nonlimiting examples of such geometric features include wires (nanowires) and tubes (nanotubes).

Existing techniques for forming nano-scale or micro-scale structured materials have included chemical (bath) deposition and electroless deposition. Chemical deposition of nanomaterials is considered to be a low-cost method that can be performed at relatively low temperatures. The method is versatile to synthesize various metal chalcogenide materials including CdS, ZnS, $Sb_2S_3$, ZnO, $SnO_2$, and $Fe_2O_3$. Chemical deposition uses chemical reactions that generally entail (1) the dissociation of ionic metal ligand complexes, (2) the hydrolysis of chalcogenide sources, and (3) the formation of solids with low solubility. Ion-by-ion growth and particle attachments are two common growth modes for the chemical deposition of thin films. During deposition, the rates of reactions are controlled to be sufficiently slow to allow materials to form gradually on a substrate rather than aggregate into large particles in solution and precipitate out. A typical growth rate of chemical deposition may be about 0.01 nm/s. In addition, since the reactions are slow, it might be expected that nucleation and growth will generally always occur together, resulting in a relatively wide size distribution.

Electroless deposition techniques can also be performed at relatively low temperatures to deposit ceramic nanomaterials. Electroless deposition differentiates from chemical deposition in that the oxidation state of metal cations is changed during the deposition and catalysis is usually needed to sustain the process. Metal chalcogenides such as $MnO_2$, ZnO, and $In_2O_3$, have been synthesized by electroless deposition methods in the past. The typical growth rate of electroless deposition is also about 0.01 nm/s.

Despite extensive research, realizing the practical benefits of microstructures remains a significant challenge. Problems encountered when growing heterogeneous nanomaterials for industrial applications have included lack of consistency in morphology/structure and/or low production rate. Other concerns have included low scalability, high cost, and human health issues.

Accordingly, there is a need for methods of manufacturing porous nano-scale or micro-scale structured materials that are controllable at high rates of production.

BRIEF DESCRIPTION OF THE INVENTION

The present invention provides methods of forming porous nano-scale or micro-scale structured materials and structured materials formed thereby.

According to one aspect of the invention, a method of forming a porous nano-scale or micro-scale structured material includes providing a solution comprising a chalcogenide source and a donor material as a source of metal ions and/or metal complexes, and contacting at least a surface of a substrate with the solution. Heat is then directed through the solution onto a portion of the surface of the substrate to locally heat a portion of the solution in contact with the portion of the surface of the substrate to produce a compound that is a reaction product of the donor material and the chalcogenide source. The compound forms as a result of the heat initiating a chemical reaction between the donor material and the chalcogenide source, and precipitates on the portion of the surface of the substrate to form nano-scale or micro-scale geometric features containing a metal chalcogenide. The portion of the surface is then cooled to produce the structured material comprising the geometric features.

Another aspect of the invention is a method of forming a nano-scale or micro-scale structured material that entails providing a donor material, providing a substrate having a curved surface portion, and reacting the donor material to form a compound that deposits on the curved surface portion of the substrate to produce nano-scale or micro-scale geometric features of the structured material. The structured material has at least one curved surface corresponding to the curved surface portion of the substrate.

According to yet another aspect of the invention, a porous nano-scale or micro-scale structured material comprises nano-scale or micro-scale geometric features and at least one curved surface corresponding to a curved surface portion of a substrate on which the structured material was formed.

According to still another aspect of the invention, a method of forming a porous nano-scale or micro-scale structured material comprising nano-scale or micro-scale geometric features includes providing a donor material, providing a substrate having a surface comprising surface cavities corresponding to the geometric features of the structured material to be formed, and reacting the donor material to form a compound that deposits on the surface of the substrate. The compound deposits in the surface cavities to produce the geometric features of the structured material, and the geometric features correspond to the surface cavities of the substrate.

Technical effects of the invention include the ability to consistently produce porous nano-scale and/or micro-scale structured materials on various substrate surfaces at potentially high controllable rates. In preferred embodiments, it is believed that porous one-dimensional (1-D), two-dimensional (2-D), and three-dimensional (3-D) geometric features may be rapidly formed by directing a localized heat source at desired locations on a substrate or other suitable template, and that sufficiently rapid heating and cooling rates may promote porosity in the resulting structured materials. Additionally, a structured material may be produced on a curved surface of a substrate such that the structured material has a curved surface that conforms or otherwise corresponds to the surface of the substrate.

Other aspects and advantages of this invention will be further appreciated from the following detailed description.

BRIEF DESCRIPTION OF THE DRAWINGS

FIGS. 9a-10d are scanned images representing laser-irradiated surfaces on substrates having an array of nanotubes of types that may be formed by a process such as that represented in FIGS. 1 and 2.

DETAILED DESCRIPTION OF THE INVENTION

The present invention generally relates to thermally-induced chemical synthesis processes or methods used to form nano-scale (nanoscopic) and/or micro-scale (microscopic) structured materials (structures). Preferably, the structured materials comprise porous geometric features that have a high surface area-to-volume ratio, and optionally may be higher-order geometric features, for example, wires (nanowires) or tubes (nanotubes).

According to an aspect of the invention, a substrate (as nonlimiting examples, a mold or template) is submerged under or is otherwise contacted by a translucent, preferably entirely transparent, solution that provides at least one donor material that will be used to form the structured materials (structures). The donor material comprises at least one source of metal ions and/or metal complexes. The solution further comprises at least one chalcogenide source (that is, a chemical compound having at least one chalcogen (oxygen, sulfur, selenium, tellurium, and polonium) anion and at least one element that is more electropositive than the chalcogen element). Nonlimiting examples of sources of metal ions and/or metal complexes include iron (ferric) nitrate ($Fe(NO_3)_3$), tin chloride ($SnCl_4$), potassium permanganate ($KMnO_4$), and zinc acetate ($Zn(O_2CCH_3)_2$). Nonlimiting examples of chalcogenide sources include nitric acid ($HNO_3$), sodium hydroxide ($NaOH$), and ammonium hydroxide ($NH_4OH$). The metal ions and/or metal complex within the solution are preferably in equilibrium with the chalcogenide source at room temperature, so as to enable initiation of a chemical reaction therebetween once the solution has been sufficiently heated to an elevated reaction temperature, and so that the chemical reaction can be stopped by cooling the solution, for example, to a temperature below the reaction temperature.

Figure 1:
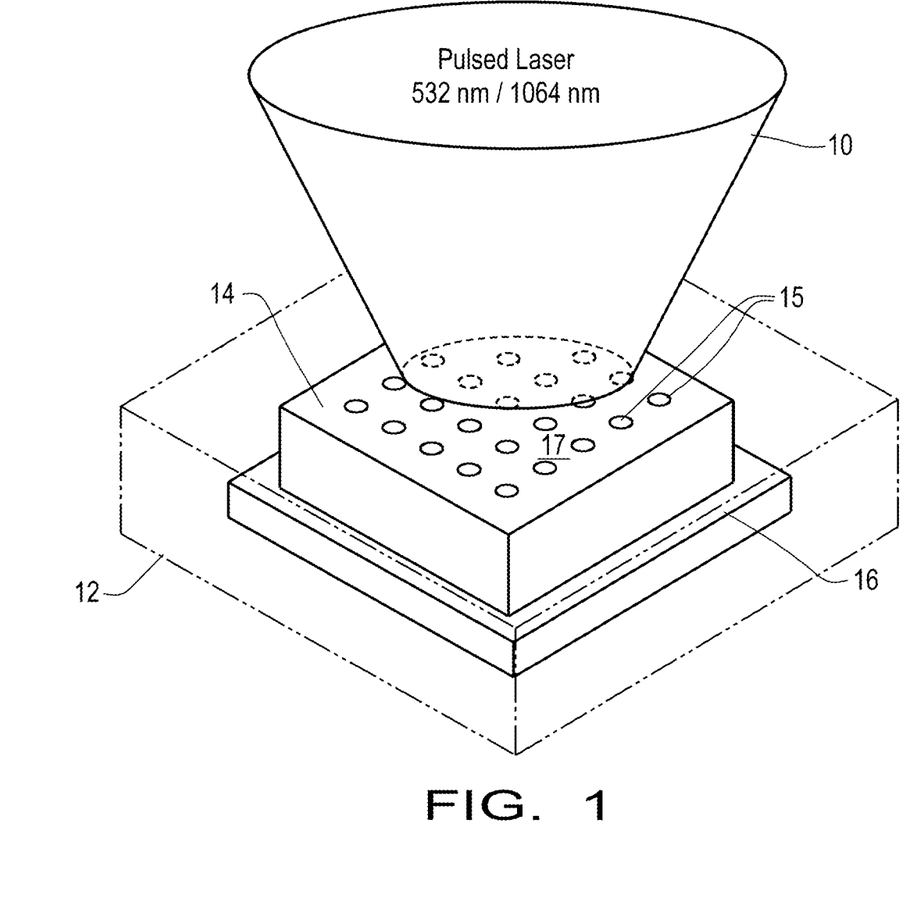
FIG. 1 schematically represents a system having curved surface portions for use in a laser-induced chemical synthesis process in accordance with certain nonlimiting aspects of the present invention, and FIG. 2 schematically represents a step of the laser-induced chemical synthesis process in accordance with certain nonlimiting aspects of the present invention.

As schematically represented in FIG. 1, the substrate 14 preferably is or comprises a porous membrane that defines a surface, referred to herein as a "working" surface 17, that may be entirely planar or may include simple and/or complex curvatures having curved surface portions, for example, surface pores or cavities 15 schematically represented in FIG. 1, as geometric surface features that correspond to the geometric features of the structured materials to be formed. The geometric surface features 15 of the substrate 14 can be sized to promote the formation of structured materials whose geometric features are mesoporous (i.e., diameters between 2 and 50 nm) or microporous (i.e., diameters less than 2 nm).

To produce the structured material, a heat source is directed through the solution onto a portion of the working surface of the substrate contacted by the solution, such that the heat source locally heats the portion of the substrate as well as a portion of the solution in contact therewith. A laser beam is a particularly suitable heat source capable of achieving localized heating, though electron beams and other sources of localized heat are foreseeable and therefore within the scope of the invention. A thermally-conductive material may be deposited or otherwise provided on a surface of the substrate oppositely disposed from the working surface to promote heating of the substrate by absorbing energy of the laser that irradiates through the substrate. As the substrate and thermally-conductive material (if present) absorb energy from the heat source, the portion of the solution contacting the portion of the substrate impinged by the heat source increases in temperature. The operating parameters of the heat source are selected to be sufficient to heat the portion of the solution to the elevated reaction temperature and thereby initiate a chemical reaction therein between the chalcogenide source and the metal ions and/or metal complexes of the donor material in the solution. The chemical reaction within such a reaction zone preferably results in the formation and precipitation of a compound, in the form of nanometer-sized crystals (nanocrystals), on the working surface of the substrate. As such, the compound is a reaction product of the chalcogenide source and the metal ions and/or metal complexes of the donor material, and therefore a metal chalcogenide. Nonlimiting examples of the compound include metal oxides and metal sulfides, including but not limited to iron oxide, tin oxide, manganese oxide, and zinc sulfide. If the compound is a metal oxide, a metal hydroxide may form as an intermediate reaction product and deprotonation of the hydroxide leads to the formation of the metal oxide.

The nanocrystals of the compound cumulatively self-assemble to form geometric features of the structured materials that conform or otherwise correspond to the shape of the working surface of the substrate, including any planar and/or curved surface regions of the working surface. As previously noted, such geometric features may comprise or consist of, for example, higher-order geometric features such as wires (nanowires) and tubes (nanotubes). A surfactant is not required and preferably is not used during the thermally-induced chemical synthesis process. Despite this, the size of the nanocrystals formed have been found to be monodisperse. Most of the nanocrystals preferably are formed to have a size in the range of less than 5 nm, and more preferably less than about 3 nm, and most preferably between about 1.5-2.5 nm. It is believed that such fine particle sizes can be achieved with or otherwise promoted by a sufficiently rapid cooling rate. For example, after the heat source passes through the reaction zone, convection of the solution results in rapid cooling of the reaction zone, which certain nonlimiting simulations have estimated to be about 200 K/s. In some cases, rapid cooling may be further promoted by the thermally-conductive material (if present) acting as a heat sink and/or conducting heat away from the substrate. For each scan of the reaction zone by the heat source, an individual geometric feature (for example, a nanowire or nanotube) may experience about one second or less of rapid heating to (or above) the reaction temperature (and therefore above the surrounding temperature), followed by rapid cooling (quenching) to a temperature at which the chemical reaction between the chalcogenide source and donor material ceases, typically below the reaction temperature. It is foreseeable that the entire reaction may take place in a matter of hundreds of nanoseconds for shorter geometric features and a few seconds for longer geometric features. However, a desired duration for the reaction (in other words, while the portions of the substrate and solution within the reaction zone are at or above the reaction temperature) may be dependent on the desired size of the geometric features (e.g., nano-scale or micro-scale), as discussed hereinafter. As such, it is within the scope of the invention to intentionally tailor the cooling rate to achieve a desired size for the geometric features, and it is believed that such tailoring can be ascertained without undue experimentation. Further, as also discussed hereinafter, the crystal size of the geometric features may be significantly increased with additional passes of the heat source.

FIG. 1 represents a system in accordance with certain nonlimiting aspects of the invention. The system includes a substrate 14 submerged in an aqueous solution 12. Though represented as entirely planar, the substrate 14 may have surface regions characterized by simple or complex curvatures. The substrate 14 is porous so as to have a plurality of cavities or surface pores 15 in a working surface 17 thereof. The substrate 14 includes a thermally-conductive thin film 16 deposited or otherwise provided on a surface thereof that is oppositely-disposed from the working surface 17 of the substrate 14. The thin film 16 serves as the aforementioned thermally-conductive material intended to promote heating and cooling of the solution 12. A heat source, in this instance, a laser beam 10, is utilized to locally heat the solution 12 in order to thermally-induce a chemical synthesis process within a reaction zone at the working surface 17 of the substrate 14 and form geometric features (24 in FIG. 2) of a structured material on the working surface 17. The laser beam 10 may be pulsed to achieve a more controllable heating rate within the reaction zone and thereby promote temperature control. Preferably, the energy density of the laser beam 10 is at a level that, while capable of sufficiently heating the solution to form the geometric features 24, causes little if any damage to the substrate 14. Although a suitable energy density is dependent on the substrate 14 and solution 12 used, an exemplary preferable energy density is believed to be less than $1 \times 10^7$ J/m$^2$.

Figure 2:
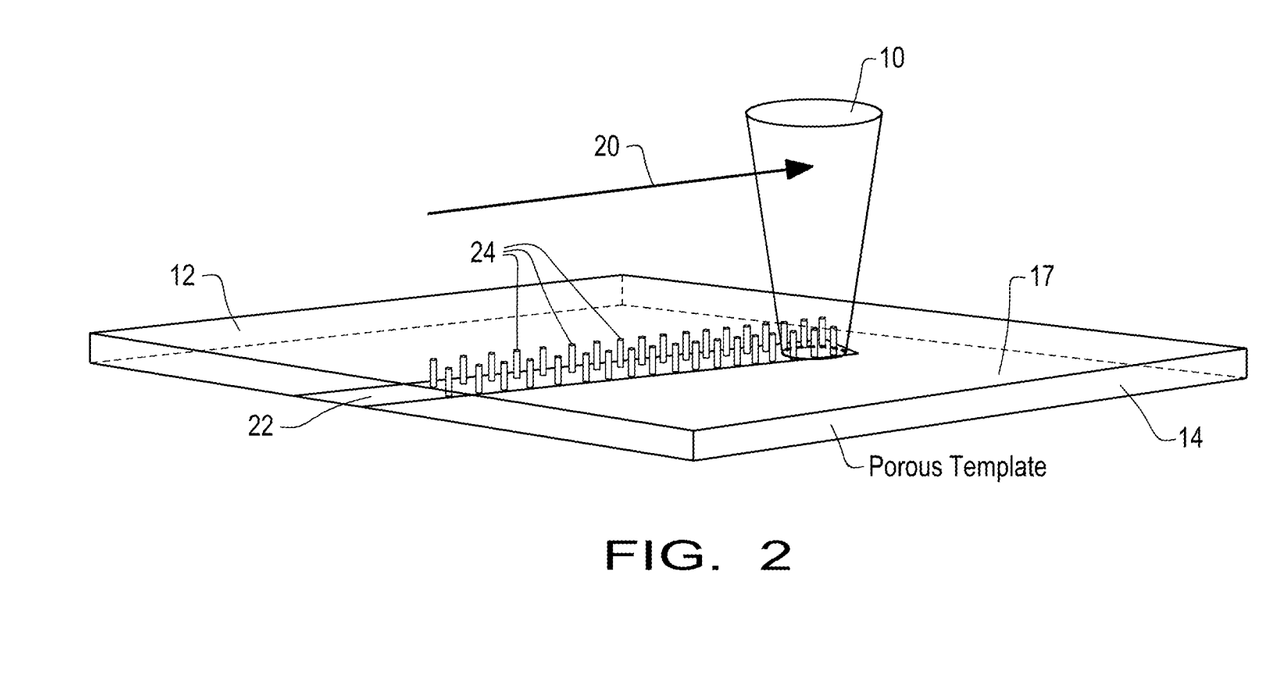
Figure 3:
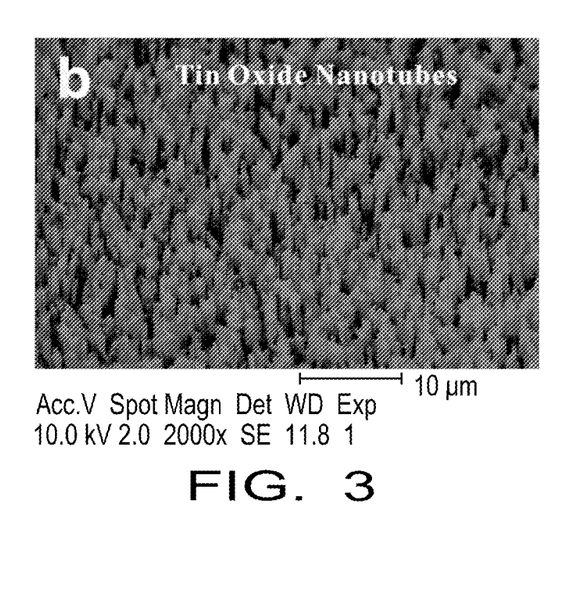
FIGS. 3 and 4 are scanned images representing arrays of nanotubes of types that may be formed by a process such as that represented in FIGS. 1 and 2.
Figure 4:
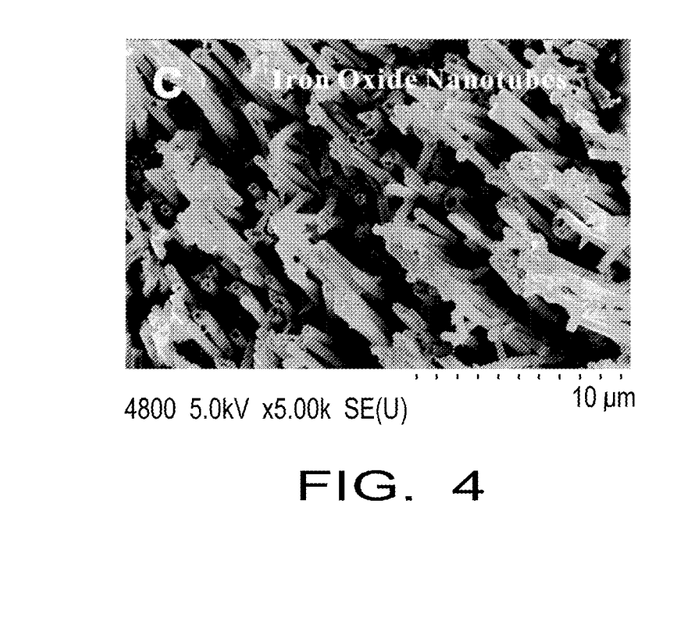
Figure 5:
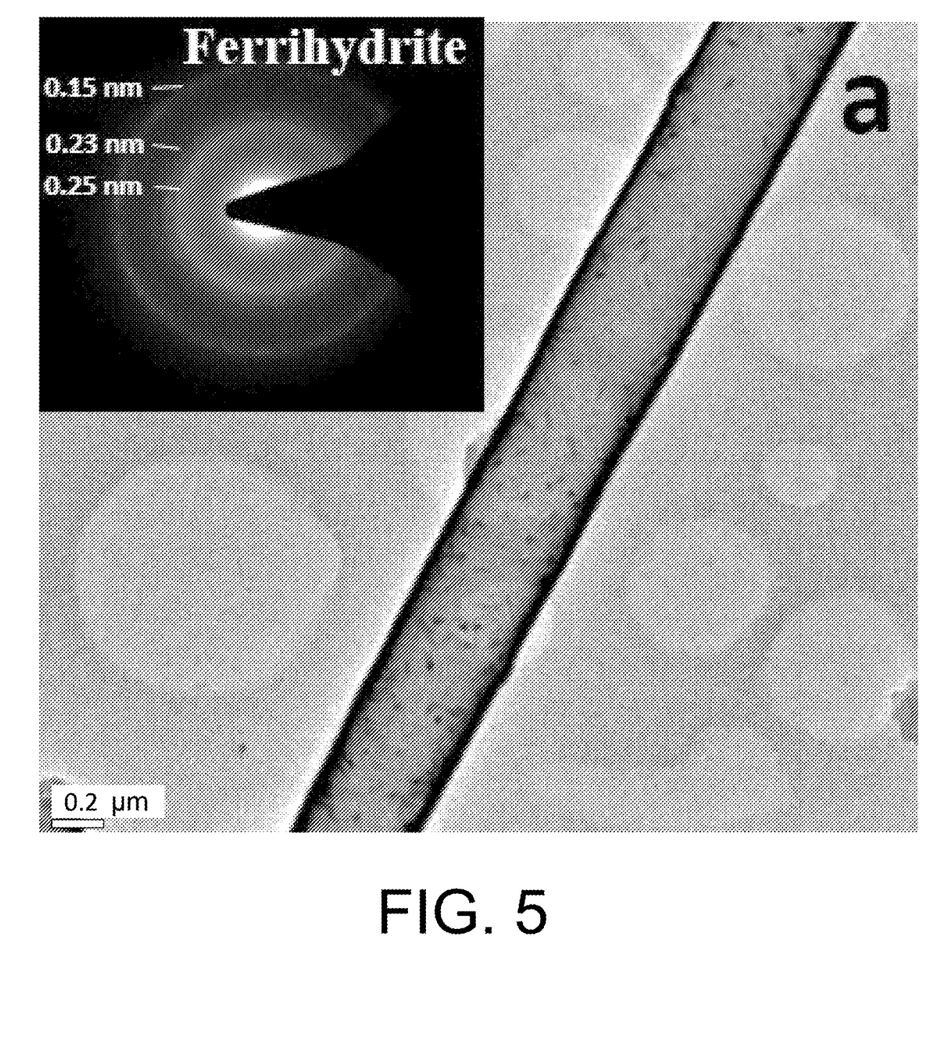
FIGS. 5-8 are scanned images representing individual nanotubes of types that may be formed by a process such as that represented in FIGS. 1 and 2.
Figure 6:
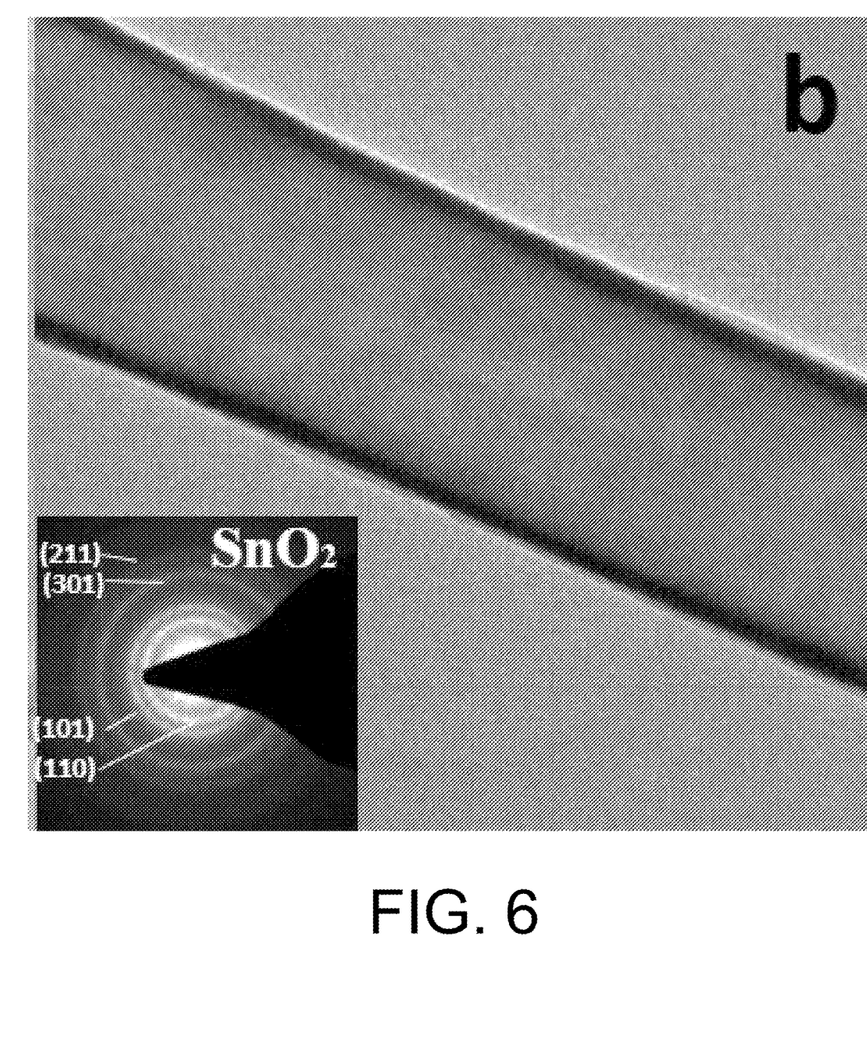
Figure 7:
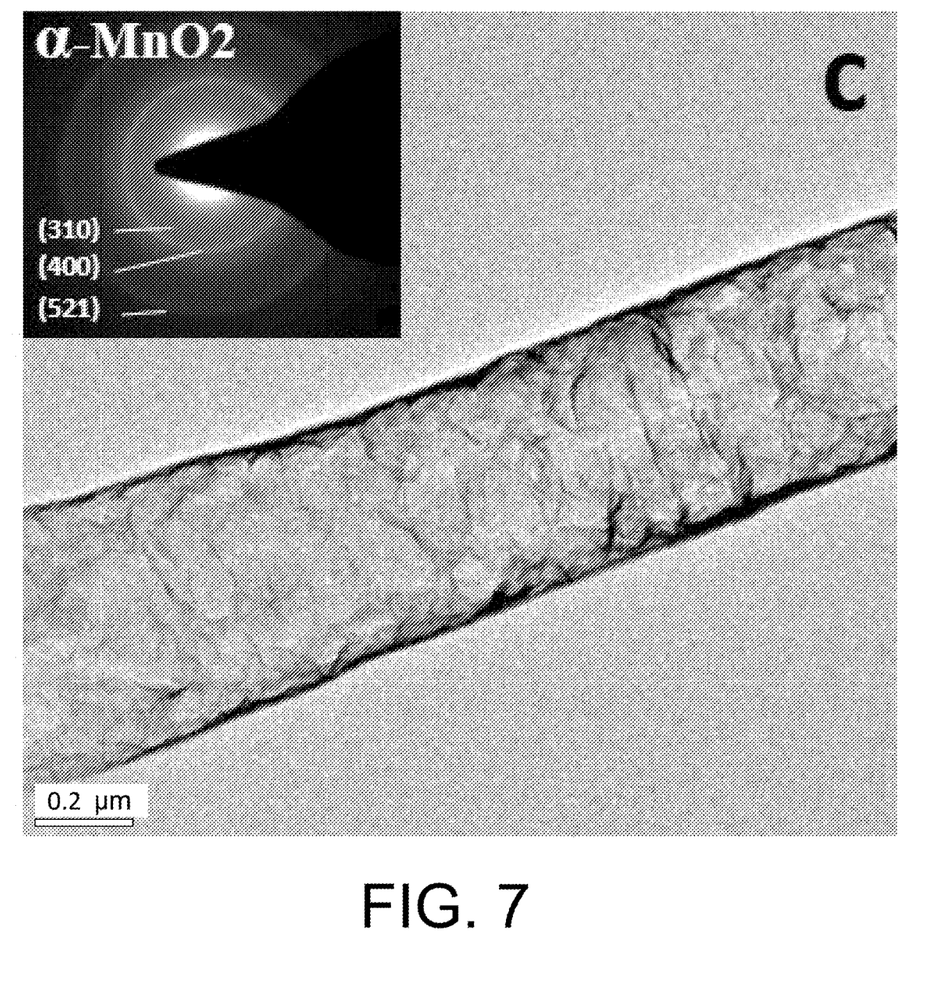

As represented in FIG. 2, the laser beam 10 may be passed in a direction 20 along the working surface 17 of the substrate 14 so that an area or path 22 of the working surface 17 is sequentially locally heated by the laser beam 10 and then cooled in order to precipitate nanocrystals of the compound and form the geometric features 24 of the structured material along the working surface 17 of the substrate 14. The geometric features 24 may be formed over the path 22 to form a continuous or discontinuous structured material and the geometric features 24 may be 1-D, 2-D, and/or 3-D structures. Nonlimiting exemplary structures include, for example, a nanowire (not shown) running along the surface 17 of the substrate 14 or, as schematically represented in FIG. 2, an array of nanotubes extending (e.g., orthogonally) from the working surface 17 of the substrate 14. FIGS. 3 and 4 represent scanned images of an array of tin oxide nanotubes and an array of iron oxide nanotubes, respectively, both formed in accordance with aspects of the invention and imaged with a scanning electron microscope (SEM).

As the laser beam 10 moves away from a portion of the working surface 17 that was heated by the beam 10, the chemical reaction initiated by the laser irradiation preferably ceases within the solution 12 overlying that portion of the working surface 17, for example, as the laser beam 10 is scanned across the working surface 17. Such a laser-induced chemical reaction is believed to be thermally activated. Heat converted from the laser irradiation or other heat source enhances the dissociation of water within the aqueous solution 12, which promotes supersaturation of metal hydroxides or metal sulfides therein, and precipitates are formed as supersaturation reaches a certain level. Laser heating may also accelerate deprotonation of the metal hydroxides to form metal oxides. Heterogamous nucleations have been observed to begin at inner surfaces of the surface pores 15 of the substrate 14, and thereafter convection and bubbling by laser heating have been observed to prevent the filling of the surface pores 15 and instead cause the nanocrystal precipitates to form in a manner that reinforces the desired geometric features 24, for example, increasing the size of the geometric features 24 rather than their density. Consequently, it is believed that embodiments in accordance with certain aspects of the present invention provide for the formation of porous open-cell structured materials that comprise porous open-cell geometric features 24 having a significantly higher surface area-to-volume ratio than previously possible with conventional methods.

The resulting porous geometric features 24 may have surface area-to-volume ratios of up to about $1.3 \times 10^{10}$ m$^{-1}$. However, it will be understood that the resulting porosity of the formed geometric features 24 will typically be dependent on the particular parameters of the method used, for example, the energy density of the laser beam 10, the speed at which the laser beam 10 traverses the substrate 14, the material of the substrate 14, and the composition of the solution 12.

Once the formation of the structured material and its geometric features 24 is complete, the substrate 14 may be removed from the structured material, for example, by dissolving the substrate 14 with an appropriate solution thereby exposing the metal oxide and/or metal sulfide geometric features 24. If desired, a thin support layer (not shown) may be formed on the exposed surface of the structured material to provide mechanical support to the geometric features 24 prior to dissolving the substrate 14. The support layer may be formed of any material that is resistant to damage and preferably undamaged during removal of the substrate 14. A nonlimiting example of such a material includes a gold thin film back plate with a layer of copper electrodeposited thereon.

The solution 12 may be any composition that is capable of precipitating a metal chalcogenide, such as a metal oxide, metal hydroxide, and/or metal sulfide, through a thermally-induced chemical reaction. It should be appreciated that the exact composition of the solution 12 will depend on the desired composition of the formed structured material and its geometric features 24. The substrate 12 may be formed of any suitable material other than the material of the geometric features 24 to be formed. Therefore, the substrate 12 may be formed of a natural or artificial material, for example, a polymer material that can be dissolved after precipitation of the metal chalcogenide compound and formation of the geometric features 24. It is believed that the method may be used to form geometric features 24 of any metal chalcogenide, including metal oxides and metal sulfides.

FIGS. 5-10 represent geometric features (nanotubes) formed by laser-induced chemical synthesis methods during investigations leading to the present invention. In the investigations, porous polymer membranes (templates) were placed into aqueous solutions containing a chalcogenide source and metal salts as donor materials and therefore sources of metal ions and/or metal complexes, and the membranes were scanned by a high frequency ytterbium pulsed laser (532 nm/1064 nm wavelength). After laser scanning, the polymer membranes were dissolved in dichloromethane to expose metal chalcogenide nanotubes that formed as a result of the laser scanning.

Figure 8:
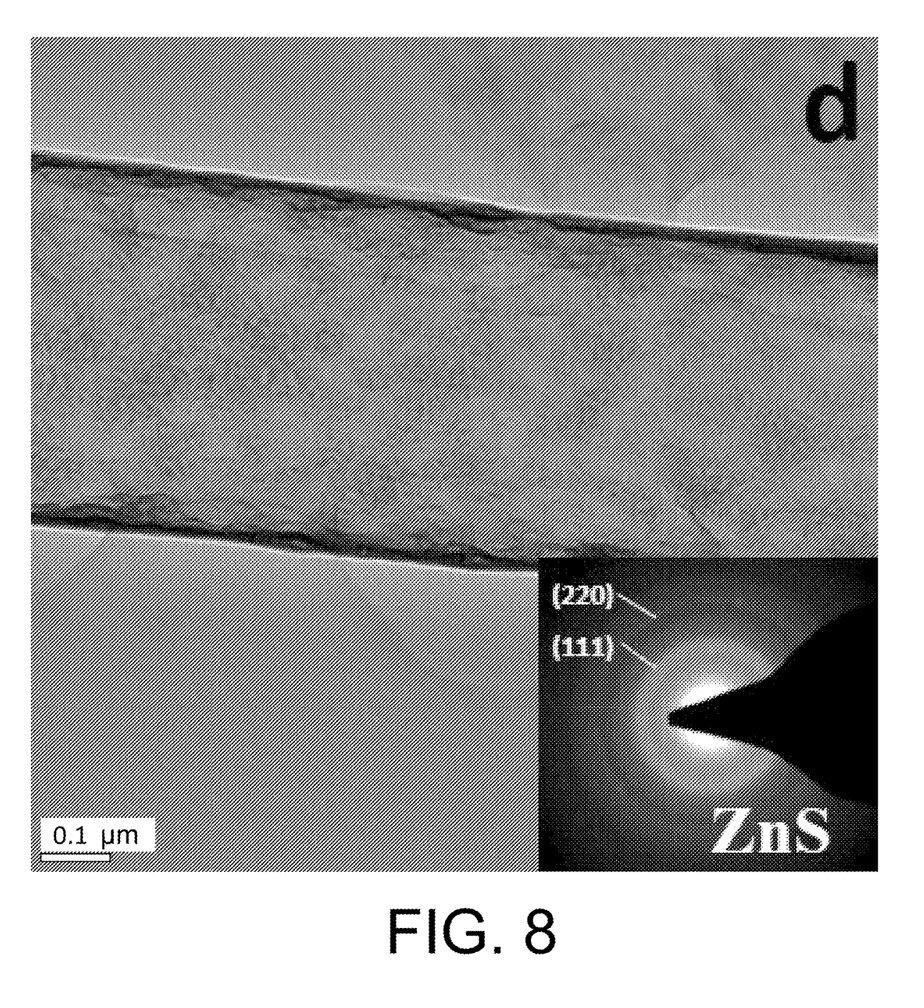

FIGS. 5-8 are TEM images of an iron oxide nanotube (FIG. 5), a tin oxide nanotube (FIG. 6), a manganese oxide nanotube (FIG. 7), and a zinc sulfide nanotube (FIG. 8). Each scanned image includes an inset representing a selected area electron diffraction (SAED) pattern of the corresponding nanotubes with the ring patterns indexed. The ring pattern indicates that the nanotubes were polycrystalline. The tin oxide ($SnO_2$) nanotube arrays were produced with a solution comprising 25 mM $SnCl_4$ as the donor material and 180 mM nitric acid as a chalcogenide source. The iron (ferric) oxide ($Fe_2O_3$) nanotube arrays were produced with a solution comprising 18 mM ferric nitrate ($Fe(NO_3)_3$) as the donor material and 10 mM nitric acid as a chalcogenide source. The manganese oxide ($MnO_2$) nanotube arrays were produced with a solution comprising 0.4 mM potassium permanganate ($KMnO_4$) as the donor material. The zinc sulfide (ZnS) nanotube arrays were produced with a solution comprising 7 mM zinc acetate as the donor material and 26 mM thiourea ($SC(NH_2)_2$), 0.3 mM sodium hydroxide (NaOH), and 8 mM ammonium hydroxide ($NH_4OH$) as chalcogenide sources.

Figure 9A:
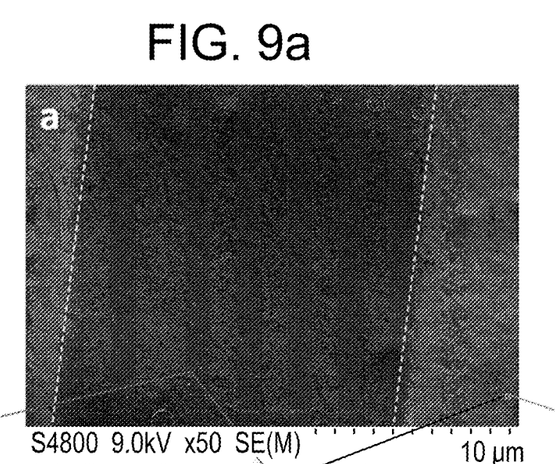
Figure 9B:
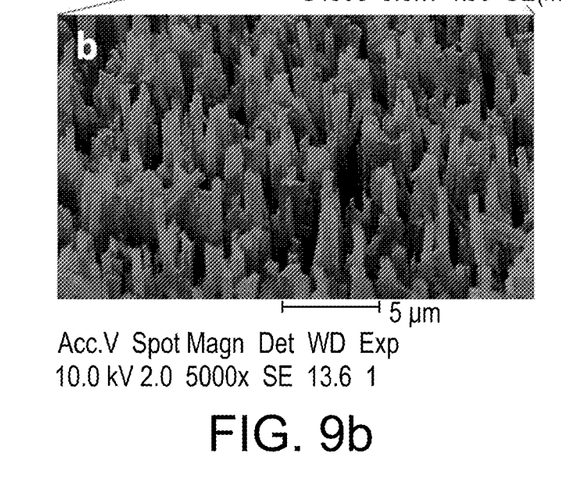
Figure 9C:
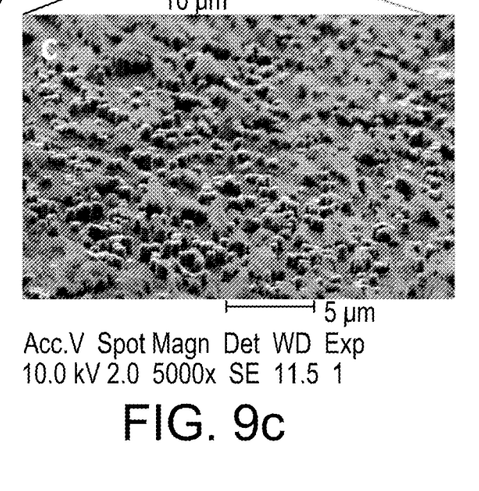

FIGS. 9a-c are scanned images showing an array of tin oxide nanotubes. FIG. 9a represents an SEM image of a path (darker area between white dashed lines) of a working surface that has been scanned with a laser beam in accordance with aspects of the invention. FIGS. 9b and 9c are higher magnification SEM images of both inside and outside the path, respectively. By comparing FIGS. 9b and 9c, it can be seen that an array of vertically standing tin oxide nanotubes were grown within the laser-irradiated path (FIG. 9b), whereas outside the path tin oxide nanotubes either did not grow or grew only slightly (FIG. 9c).

Figure 10A:
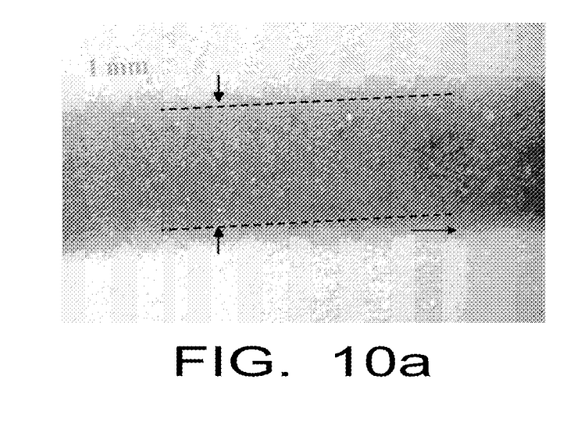
Figure 10B:
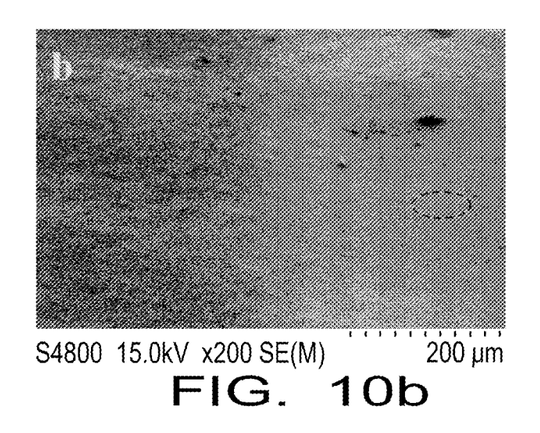
Figure 10C:
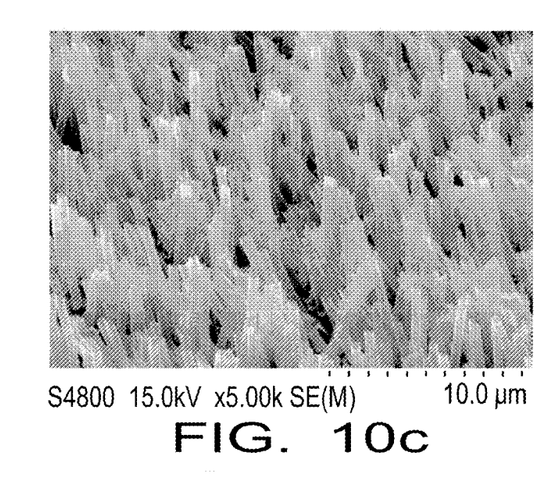
Figure 10D:
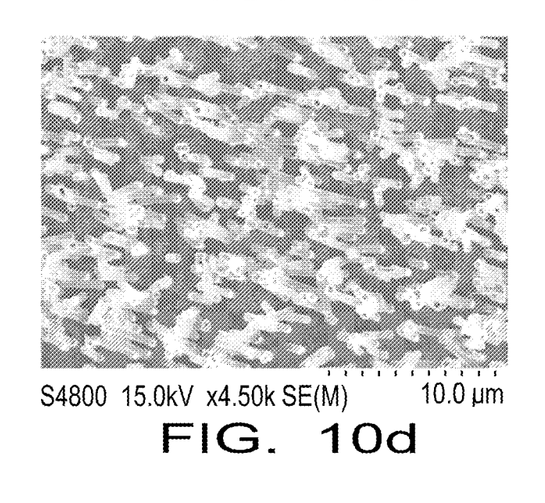

FIGS. 10a-d are scanned images showing an array of ferrihydrite (Fh) nanotubes formed in accordance with aspects of the invention. The ferrihydrite nanotubes were formed from aqueous solutions comprising 18 mM iron nitrate nonahydrate ($Fe(NO_3)_3 \cdot 9H_2O$) and various amounts of nitric acid or sodium hydroxide to obtain specific pH values for the solutions. FIG. 10a is an image taken with a charge-coupled device (CCD) camera of a path of a working surface that has been scanned with a laser beam prior to the substrate being removed. FIG. 10b is an SEM image of an edge of the path after removal of the substrate. FIGS. 10c and 10d are SEM images of nanotubes formed in a location indicated by a dashed circle in FIG. 10b.

The nanotubes formed during the investigations leading to the present invention varied in length, wall thickness, crystal size, and pore size depending on the variables used. However, these nanotubes shared the characteristics of extremely large surface-to-weight ratios, three-dimensional architectures with hollow cores in the interior, and enhanced electrical conduction along their long axes. The nanotubes were formed by the precipitation of nanocrystals which formed in rings connected by a twinning structure. The nanotubes formed in arrays along the path of the heat source and had an area density about the same as the pore density of the substrate used. The diameter of each individual nanotube was controlled by and corresponded to the size of the pore in the substrate from which the nanotube grew. The heights (lengths) and wall thicknesses of the nanotubes were dependent on the laser parameters and reaction variables.

The investigations determined that laser-induced chemical synthesis methods are capable of providing growth rates that are significantly larger than conventional methods used to produce nanotubes, with growth rates exceeding 100 nm/s in some instances, depending on processing conditions. Such fast growth rates were attributed to the high extent of supersaturation, high reaction temperatures, and rapid mass transport by fluid convection. The influences of the extent of supersaturation and reaction temperatures on the nucleation rate can be expressed in the following formula.

$$n_{het} = a_{for} Z I C_{ad} N_A \exp\left[-\frac{16}{3}\pi\left(\frac{\gamma CL}{kT}\right)^3 \left(\frac{1}{C_C N_A}\right)^2 \frac{1}{(v\ln S)^2} f\right]$$

where $n_{het}$ is the heterogeneous nucleation rate; $a_{for}$ is the volumetric surface of foreign particles; Z is the Zeldovic factor; I is the impact coefficient; $C_{ad} N_A$ is the number of molecules adsorbed on the foreign surface; γCL is the surface tension between the solid crystal phase and the liquid; k is the Boltzmann constant; T is the reaction temperature; $C_C$ is the molar density of the solid; $N_A$ is the Avogadro constant; v is the number of ions; S is the supersaturation and f is the geometric correction factor. According to the above equation, the nucleation rate should increase significantly by increasing both the extent of supersaturation and the temperature.

The growth rates of the nanotubes were also concluded to be affected by the power of the laser beam. Further investigations revealed that increasing the laser power increased growth rates, which may result in longer nanotubes for a predetermined number of laser passes. It was further concluded that the processes of precipitation, nucleation, and dehydration were all accelerated by localized heating. It was also thought that longer nanotubes may be grown with thicker substrates.

In addition, these investigations indicated that increasing the growth rate or yield of the nanocrystals without causing a significant change in crystal size may be achieved by increasing the pH value of the aqueous solution, and that increasing the crystal size and/or wall thickness of the nanotubes may be achieved by increasing the number of scanning passes with the laser beam. For example, it was found that an increase in the pH value of the aqueous solution from 1.33 to 2.16 almost tripled the growth rate of ferrihydrite nanotubes, while the crystal size remained little changed. Notably, increasing the number of laser scanning passes at a given power coarsened or thickened the nanocrystals.

The methods disclosed herein provide an approach to forming nano-scale or micro-scale structured materials comprising geometric features, including arrays of nanostructures, nanomaterials, nanofeatures, etc., at fast rates with high consistency relative to conventional formation techniques. Thermally-induced chemical synthesis methods, and particularly the laser-induced chemical synthesis techniques used in the investigations, have an additional advantage over the prior art by not requiring an elevated temperature environment or a vacuum condition. The resulting structured materials are capable of having a high surface area-to-volume ratio, and can be produced on a substrate surface region that is planar or has a simple or complex curvature.

Whereas the above processes were described above as using a heat source, such as a laser beam, to locally heat a solution and thereby cause a material to precipitate and deposit on a substrate to form a structured material, it is foreseeable that other types of deposition methods may be utilized to form porous micro-scale and nano-scale structured materials on surfaces having planar and/or simple or complex curved regions. For example, it is believed that a substrate having such a surface may be used in combination with other deposition processes, for example, thermal evaporation deposition, thermal driven chemical synthesis, electroplating, aerosol injection, ink jet printing, chemical vapor deposition, plasma vapor deposition, and any other type of process suitable for depositing particles or crystals into the pores/cavities of the substrate to form shells or solid forms. These processes could generally be performed according to known practices, improved by the use of the substrates described herein. Regardless of the deposition method used, the substrate preferably comprises geometric surface features in the form of surface pores or cavities that correspond in size and shape to the desired nano-scale or micro-scale geometric features to be formed. In view of the above exemplary alternative aspects of the invention, it should be clear that the invention is not limited to processes that involve directing a heat source toward a solution to create chemical synthesis within the solution.

The above-described processes may be used to produce porous micro-scale or nano-scale structured materials having simple or complex geometric features for a wide variety of applications. For example, structured materials comprising geometric features as described above are capable of exhibiting electronic mobility and strength for use in solar cells, microelectromechanical (MEMS) systems, nanoelectronic devices, semiconductor devices, superconductor devices, and mechanical devices, including such nonlimiting examples as lithium ion batteries, supercapacitors, gas sensors, and photoelectrochemical devices. In particular, the above processes may be used to form powerful sandwich-type batteries by depositing appropriate materials on planar or complex surfaces of substrates, or catalytic converters and filters may be formed by depositing appropriate materials on existing working surfaces of micro-scale particles. It is also foreseeable that complex structured materials of other than binary materials may be produced with the above-described processes.

While the invention has been described in terms of specific embodiments, it is apparent that other forms could be adopted by one skilled in the art. For example, the physical configuration of the substrate could differ from that shown, and materials and processes/methods other than those noted could be used. Therefore, the scope of the invention is to be limited only by the following claims.

The invention claimed is:

1. A method of forming a nano-scale or micro-scale discontinuous structured material, the method comprising:
providing a substrate having a working surface, at least a portion of the working surface comprising curved surface portions formed by surface cavities and corresponding to nano-scale or micro-scale geometric features of the discontinuous structured material to be formed;
combining a donor material and a second material to form a solution, the donor material being a source of metal ions and/or metal complexes, the donor material and the second material initiating a chemical reaction therebetween if the solution is at a reaction temperature and the donor material and the second material being in equilibrium in the solution at a second temperature below the reaction temperature;
contacting the working surface of the substrate and the surface cavities therein with the solution while the donor material and the second material are in equilibrium in the solution;
using a pulsed laser to generate a pulsed laser beam that is passed along the working surface of the substrate so that reaction zones at the working surface are sequentially locally heated by sequential laser pulses of the pulsed laser beam and then sequentially cooled between each immediately sequential pair of the sequential laser pulses, each of the reaction zones being heated by the sequential laser pulses to at least the reaction temperature to react the donor material and the second material to form nanocrystals of a compound, and each of the reaction zones being cooled between each of the immediately sequential pair of the sequential laser pulses to a temperature below the reaction temperature so that the chemical reaction between the donor material and the second material ceases between each of the immediately sequential pair of the sequential laser pulses and during which the nanocrystals of the compound initially deposit in the surface cavities and thereafter cumulatively self-assemble to form the geometric features of the discontinuous structured material and each of the geometric features extends orthogonally from a corresponding one of the surface cavities and has at least one curved surface corresponding to the curved surface portions of the surface cavities in the working surface of the substrate.

2. The method of claim 1, wherein the second material is a chalcogenide source.

3. The method of claim 2, wherein the discontinuous structured material is a porous open-cell structured material and the geometric features thereof comprise open-cell, porous geometric features.

4. The method of claim 2, wherein the geometric features comprise at least one of nanotubes and nanowires.

5. The method of claim 1, wherein the pulsed laser beam has an energy density of less than $1 \times 10^7$ J/m$^2$.

6. The method of claim 1, further comprising:
depositing a support layer on a surface of the discontinuous structured material oppositely-disposed from the substrate after producing the discontinuous structured material; and then
dissolving the substrate.

7. The method of claim 1, wherein the discontinuous structured material is a component of a solar cell, microelectromechanical system, nanoelectronic device, semiconductor device, superconductor device, or mechanical device.

8. The method of claim 1, further comprising additional curved surface portions on the working surface that are formed by geometric surface features.

9. The method of claim 1, wherein the discontinuous structured material is a porous open-cell structured material and the geometric features thereof comprise porous open-cell geometric features.

10. The method of claim 1, wherein the geometric features comprise at least one of nanotubes and nanowires.

11. The method of claim 1, further comprising:
providing a second surface oppositely-disposed from the working surface, the second surface not being contacted by the solution and instead being a heat sink to conduct heat away from the working surface of the substrate; and
during the use of the pulsed laser, the second surface conducting heat away from the working surface between the laser pulses.

* * * * *